United States Patent
Liu

(10) Patent No.: US 8,466,001 B1
(45) Date of Patent: Jun. 18, 2013

(54) LOW-COST SOLUTION APPROACH TO DEPOSIT SELENIUM AND SULFUR FOR CU(IN,GA)(SE,S)2 FORMATION

(75) Inventor: Wei Liu, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/330,836

(22) Filed: Dec. 20, 2011

(51) Int. Cl.
*H01L 21/00* (2006.01)

(52) U.S. Cl.
USPC 438/95; 438/47; 257/E29.079; 257/E31.003; 257/E31.007; 136/244; 136/262; 136/264; 136/265

(58) Field of Classification Search
USPC ............ 438/95; 257/E21.001; 136/244, 264, 136/265, 258; 106/31.13; 205/239
See application file for complete search history.

(56) References Cited

U.S. PATENT DOCUMENTS

| | | | |
|---|---|---|---|
| 5,804,054 A | * | 9/1998 | Bhattacharya et al. ....... 205/239 |
| 2009/0260670 A1 | * | 10/2009 | Li ................................. 136/244 |

* cited by examiner

*Primary Examiner* — Charles Garber
*Assistant Examiner* — Abdulafattah Mustapha

(57) ABSTRACT

Methods of forming copper indium gallium diselenide (CIGS) layers for photovoltaic devices are disclosed. In one aspect, a solution based selenization method in the formation of CIGS is provided. In some embodiments a substrate containing elemental copper (Cu), indium (In) and gallium (Ga) is coated with a solution comprising a source of selenium (Se) dissolved in a solvent. After coating with the selenium based solution, the substrate is heated to form the CIGS layer. Coating of the substrate with the selenium based solution may be carried out by dip coating, slit casting, gap coating, ink-jet type coating, among other techniques. The solution based selenization method disclosed herein provides high material utilization and low cost, unlike vacuum based processes.

19 Claims, 1 Drawing Sheet

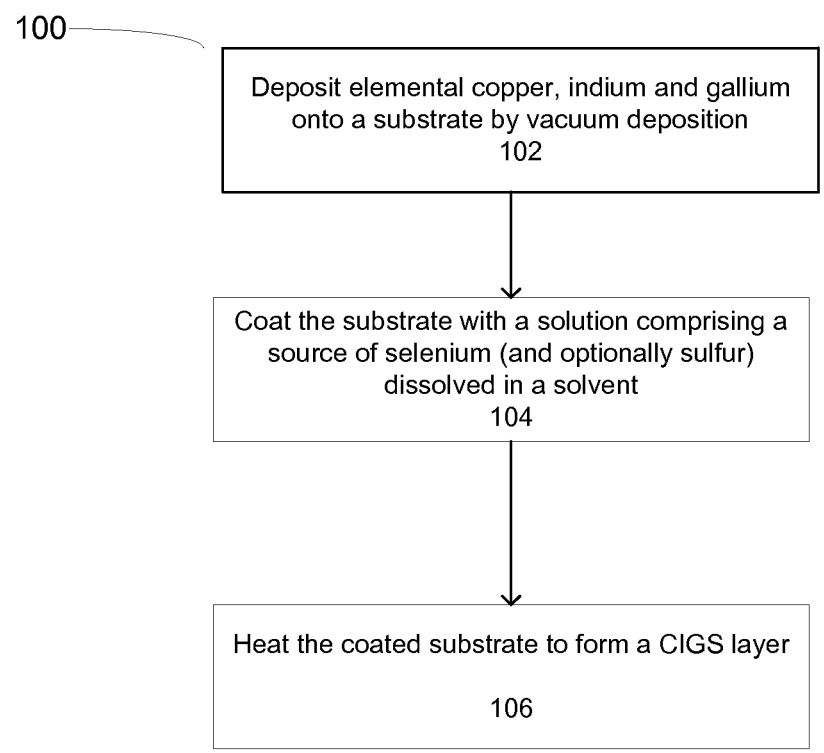

LOW-COST SOLUTION APPROACH TO DEPOSIT SELENIUM AND SULFUR FOR CU(IN,GA)(SE,S)2 FORMATION

TECHNICAL FIELD

The present disclosure relates generally to the field of photovoltaic devices and processing, and more particularly to selenization methods in the formation of copper indium gallium diselenide (CIGS) photovoltaic devices.

BACKGROUND

Solar cells are photovoltaic (PV) devices that convert light into electrical energy. Photovoltaic devices have been developed as clean, renewable energy sources to meet growing energy demand. Photovoltaic devices are being developed for a wide number of commercial markets including residential rooftops, commercial rooftops, utility-scale PV projects, building integrated PV (BIPV), building applied PV (BAPV) applications and the like. Widespread adoption of PV technology has not yet arrived, due in part to the high cost per watt for PV devices, particularly when compared to traditional electrical utility costs.

Currently, crystalline silicon based solar cells or photovoltaic devices (single crystal, multicrystalline and polycrystalline) are the dominant technologies in the market. Crystalline silicon (cSi) solar cells must use a thick substrate (>100 um) of silicon to absorb the sunlight since it has an indirect band gap. Also, the absorption coefficient is low for crystalline silicon because of the indirect band gap. The use of a thick substrate also means that the crystalline silicon solar cells must use high quality material to provide long carrier lifetimes to allow the carriers to diffuse to the contacts. Therefore, crystalline silicon solar cell technologies lead to increased costs.

Thin film photovoltaic (TFPV) devices have received increased interest as a replacement to crystalline silicon based PV devices. A variety of TFPV devices have been developed, such as TFPV devices based on amorphous silicon (a-Si), copper indium gallium diselenide (CIGS), and cadmium telluride (CdTe). Among these thin film technologies, some have already been very successful commercially and achieved much lower cost per watt than conventional Si-based PV. For example, CdTe-based thin film PV has demonstrated much lower cost and higher profitability than Si in recent years. CIGS based PV devices have garnered particular interest due to high demonstrated efficiencies when compared to the other TFPV materials.

Currently, CIGS layers used in PV devices are typically formed using vacuum based deposition processes where individual metal sources of copper, indium, gallium and selenium are evaporated towards a substrate in a vacuum chamber. Such vacuum based evaporation deposition processes are expensive, require high capital costs, and precise processing. Material utilization is poor, which further adds to the high manufacturing costs.

Co-evaporation of selenium onto a high temperature substrate in a high temperature environment causing many issues (e.g., Se corrosion, Se flux control) and is one of the largest challenges and bottlenecks in production of CIGS. Evaporation processes typically have a low material utilization rate and a limited material deposition rate, thus resulting in high raw material cost and low throughput. Process stability is another big issue for CIGS manufacturing using co-evaporation based technique. Achieving uniform film deposition across a large-area substrate is another significant challenge with currently known methods.

Another known selenization technique is carried out in a selenization furnace using a source of selenium such as $H_2Se$. $H_2Se$ poses a significant safety risk even when diluted $H_2Se$ is used as the reactant. This increases the reaction time, which can be on the order of hours. Such furnaces are typically operated in batch mode, which significantly limits throughput. Moreover, many furnaces are needed to achieve desirable production volume, thus increasing capital and operating costs.

The manufacture of TFPV devices entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

Thus, further developments are needed, particularly processes that lower the cost of manufacturing CIGS based PV devices and address some of the limitations of the current selenization techniques.

SUMMARY

Methods of forming copper indium gallium diselenide (CIGS) layers for photovoltaic devices are disclosed. In one aspect, a solution based selenization method in the formation of CIGS is provided. In some embodiments a substrate containing elemental copper (Cu), indium (In) and gallium (Ga) is coated with a solution comprising a source of selenium (Se), and optionally sulfur (S), dissolved in a solvent. After coating with the selenium (and optionally, a sulfur) based solution, the substrate is heated to form the CIGS layer. Coating of the substrate with the selenium (and optionally, sulfur) based solution may be carried out by spin-coating, dip coating, slit casting, gap coating, ink-jet type coating, among other techniques. The solution based selenization method disclosed herein provides high material utilization and low cost, unlike vacuum based processes.

In some embodiments, a method of selenization in the formation of a CIGS layer in a photovoltaic device is provided. A substrate containing elemental copper, indium and gallium is coated with a solution comprising a source of selenium dissolved in a solvent. The coated substrate is then heated to form the CIGS layer.

In some embodiments, a method of selenization in the formation of a copper indium gallium diselenide (CIGS) layer in a photovoltaic device is provided, comprising: coating a substrate containing elemental Cu, In and Ga with a solution comprising a source of selenium (Se) dissolved in a solvent, to form a layer comprising Se on the substrate and where a thickness or composition of the layer is determined during the coating step by any one or more of: thickness of the solution, concentration of Se in the solution, viscosity of the solution, or speed of coating the solution on the substrate; and heating the coated substrate.

In some embodiments, a method of forming a CIGS layer on a substrate is provided. Elemental copper, indium and gallium are deposited onto the substrate by vacuum deposition. The substrate is then coated with a solution comprising a source of selenium dissolved in a solvent.

In some embodiments, the selenium solution is coated on the substrate by any one of more of the following techniques: spin-coating, dip coating, slit casting, gap coating, and the like. In some embodiments the selenium solution is coated on the substrate by ink-jet coating techniques. In some embodiments the Se layer is formed having a desired thickness. The thickness of the Se layer may be varied during the coating step by adjusting any one or more of: thickness of the solution, concentration of Se in the solution, viscosity of the solution, or speed of coating the solution on the substrate.

BRIEF DESCRIPTION OF THE DRAWINGS

The techniques of the present invention can readily be understood by considering the following detailed description in conjunction with the accompanying drawings, in which:

FIG. 1 is flowchart illustrating methods of the present disclosure according to some embodiments.

DETAILED DESCRIPTION

A detailed description of one or more embodiments is provided below along with accompanying figures. The detailed description is provided in connection with such embodiments, but is not limited to any particular example. Numerous specific details are set forth in the following description in order to provide a thorough understanding and are not intended to limit the scope of the invention in any way. These details are provided for the purpose of example and the described techniques may be practiced according to the claims without some or all of these specific details.

As used herein, the term "CIGS" is understood to represent the entire range of related alloys denoted by $Cu_zIn_{(1-x)}Ga_xS_{(2+w)(1-y)}Se_{(2+w)y}$, where $0.5 \leq z \leq 1.5$, $0 \leq x \leq 1$, $0 \leq y \leq 1$, $-0.2 \leq w \leq 0.5$ Any of these materials may be further doped with a suitable dopant.

Methods of forming copper indium gallium diselenide (CIGS) layers for photovoltaic devices are disclosed. In some embodiments, a solution based selenization method in the formation of CIGS is provided. FIG. 1 is a flow chart illustrating a method 100 of forming CIGS layers for photovoltaic (PV) devices according to some embodiments of the present disclosure. Elemental copper (Cu), indium (In) and gallium (Ga) are deposited onto the substrate by vacuum deposition at step 102. The substrate is then coated with a solution comprising a source of selenium (and optionally a source of sulfur) dissolved in a solvent at step 104. The coated substrate is heated at step 106 to form the CIGS layer.

The substrate may be any suitable photovoltaic substrate. In some embodiments, suitable substrates comprise glass, coated glass, float glass, low-iron glass, borosilicate glass, flexible glass, specialty glass for high temperature processing, stainless steel, carbon steel, aluminum, copper, titanium, molybdenum, polyimide, plastics, cladded metal foils, flexible substrates, and the like. Furthermore, the substrates may be processed in many configurations such as single substrate processing, multiple substrate batch processing, inline continuous processing, roll-to-roll processing, and the like.

Elemental copper (Cu), indium (In) and gallium (Ga) are deposited onto the substrate by vacuum deposition at step 102. Any suitable vacuum deposition process may be used, such as but not limited to: evaporation, physical vapor deposition, chemical vapor deposition, and the like. In some embodiments, these elemental metals are deposited by evaporation or sputtering from suitable metal targets, such as copper sputter targets, binary copper-gallium sputter targets and indium sputter targets.

A solution comprising a source of selenium dissolved in a solvent is coated onto the substrate at step 104. Any suitable solution may be used. In some embodiments, the solution is comprised of selenium dissolved in a suitable solvent(s). In some embodiments a metal chalcogenide, is used as the source of selenium. Examples of suitable solvents include without limitation: hydrazine, hydrous hydrazine, and/or a hydrazine-like solvent, such as ethanolamine, ethylene diamine (EDA), propylene diamine (PDA), dimethyl sulfoxide (DMSO), and mixtures thereof. The concentration of selenium in the solvent can be up to about 10 M, or more typically in the range of about 0.1 M to about 5 M. The viscosity of the solution may be controlled by adjusting the concentration of the Se in the solution. Generally, the viscosity of the solution is decreased by increasing the amount of solvent in the solution. In some embodiments, the solvent is a mixture of hydrazine with one or more co-solvents, such as water and/or EDA.

In some embodiments, the selenium based solution is prepared by adding anhydrous hydrazine slowly to a vial containing elemental Se in an oxygen-free inert atmosphere.

Coating of the substrate with the selenium based solution at step 104 may be carried out by any suitable technique. In some embodiments the substrate is coated with the selenium based solution by dip coating. In some embodiments the substrate is coated with the selenium based solution by ink-jet type coating or printing. In some embodiments the substrate is coated with the selenium based solution by slit casting. In some embodiments the substrate is coated with the selenium based solution by gap coating. In further embodiments, the substrate is coated by spraying the selenium based solution on the substrate, or by wet chemical deposition onto the substrate. In a further aspect, roll-to-roll processing may be used on flexible substrates such as metal foils and polyimide films. In any of the above embodiments, an inline process and system may be used and configured to achieve high throughput.

Very high material utilization rates of selenium can be achieved according to embodiments of the present disclosure. Using the solution based selenization methods of the present disclosure, selenium is dissolved in the solvent and thus is completely available for coating onto the substrate. Prior art techniques based on vacuum evaporation have low material utilization rates since much of the selenium is evaporated onto the chamber walls and pumped out of the chamber by the vacuum pumps.

After coating of the substrate with the selenium based solution, the coated substrate is heated at step 106 to form the CIGS layer. A moderate, intermediate drying or heating step may first be performed to drive out the solvent. Heating or annealing to produce the CIGS layer is carried out at any suitable temperature and duration. In some embodiments, heating is carried out in an inert environment at a temperature in the range of about 200 to about 650 C, and for a duration in the range of about 1 to about 300 minutes.

In some embodiments, methods of the present disclosure enable facile control of the film thickness and/or the selenium concentration in the formed CIGS layer. In some embodiments, selenium concentration is varied by adjusting the concentration of selenium in the solution. In some embodiments, selenium concentration is varied by adjusting the supply rate of the solution as the substrate is coated. For example, when using an ink-jet type coating technique, the solution thickness can be tuned by adjusting the flow rate of the solution that is applied to the substrate. Alternatively, the substrate may be moved at a particular speed during the coating process, thereby varying the thickness of selenium coated onto the substrate.

The invention has been described in relation to particular examples, which are intended in all respects to be illustrative rather than restrictive. Various aspects and/or components of the described embodiments may be used singly or in any combination. It is intended that the specification and examples be considered as exemplary only, with a true scope and spirit of the invention being indicated by the claims.

What is claimed is:

1. A method of selenization in the formation of a copper indium gallium diselenide (CIGS) layer in a photovoltaic device, comprising:
    coating a substrate containing elemental Cu, In and Ga with a solution comprising a source of selenium (Se) dissolved in a solvent to form a layer comprising Se on the substrate, and wherein a thickness or composition of the Se layer is determined during the coating step by measuring any one or more of: thickness of the solution, concentration of Se in the solution, viscosity of the solution, or speed of coating the solution on the substrate; and
    heating the coated substrate.

2. The method of claim 1 wherein the step of coating is performed by any one or more of: spin coating, dip coating, curtain coating, blade coating, ink-jet type coating, slit casting, or gap coating.

3. The method of claim 1 wherein the step of coating is performed by spraying.

4. The method of claim 1 wherein the step of coating is performed by ink jet coating or ink-jet printing.

5. The method of claim 1 wherein the solution is comprised of selenium dissolved in a solvent.

6. The method of claim 5 wherein the solvent is comprised of any one or more of: hydrazine, hydrous hydrazine, ethanolamine, ethylenediamine (EDA), propylenediamine (PDA), dimethyl sulfoxide (DMSO) or mixtures thereof.

7. The method of claim 5 wherein the concentration of selenium in the solvent is up to about 10 M.

8. The method of claim 5 wherein the concentration of selenium in the solvent is in the range of about 0.1 M to about 5 M.

9. The method of claim 1 wherein the heating step is carried out in an inert environment at a temperature in the range of about 200 to about 650 C.

10. The method of claim 9 wherein the heating step is carried out for a duration in the range of about 1 to about 300 minutes.

11. A method of forming a copper indium gallium diselenide (CIGS) layer on a substrate, comprising:
    depositing elemental copper, indium and gallium onto the substrate;
    then coating the substrate with a solution comprising a source of selenium (Se) dissolved in a solvent; and
    heating the coated substrate to form the CIGS layer.

12. The method of claim 11 wherein the step of depositing is comprised of any one or more of: electrodeposition, electroless deposition, evaporation, physical vapordeposition, sputter deposition or chemical vapor deposition.

13. The method of claim 11 wherein the step of coating is carried out by any one or more of: spin-coating, dip coating, curtain coating, blade coating, ink-jet type coating, slit casting, gap coating or spraying.

14. The method of claim 11 wherein the step of coating is carried out by ink jet coating or ink-jet printing.

15. The method of claim 11 wherein the solution is comprised of selenium dissolved in a solvent.

16. The method of claim 15 wherein the solvent is comprised of any one or more of: hydrazine, hydrous hydrazine, ethanolamine, ethylenediamine (EDA), propylenediamine (PDA), dimethyl sulfoxide (DMSO) or mixtures thereof.

17. The method of claim 15 wherein the concentration of selenium metal in the solvent is in the range of about 0.1 M to about 5 M.

18. The method of claim 11 wherein the heating step is carried out in an inert environment at a temperature in the range of about 200 to about 650 C and for a duration in the range of about 1 to about 300 minutes.

19. The method of claim 11 wherein the Se layer is formed having a desired thickness by varying during the coating step, any one or more of: thickness of the solution, concentration of Se in the solution, viscosity of the solution, or speed of coating the solution on the substrate.

* * * * *